June 23, 1959 J. E. LINDSAY 2,892,165

TEMPERATURE STABILIZED TWO-TERMINAL SEMI-CONDUCTOR FILTER CIRCUIT

Filed Oct. 27, 1954

INVENTOR.
James E. Lindsay
BY H. W. Newton
ATTORNEY.

United States Patent Office 2,892,165
Patented June 23, 1959

2,892,165

TEMPERATURE STABILIZED TWO-TERMINAL SEMI-CONDUCTOR FILTER CIRCUIT

James E. Lindsay, Moorestown, N.J., assignor to Radio Corporation of America, a corporation of Delaware Application October 27, 1954, Serial No. 465,091
7 Claims. (Cl. 333—80)

Figure 1:
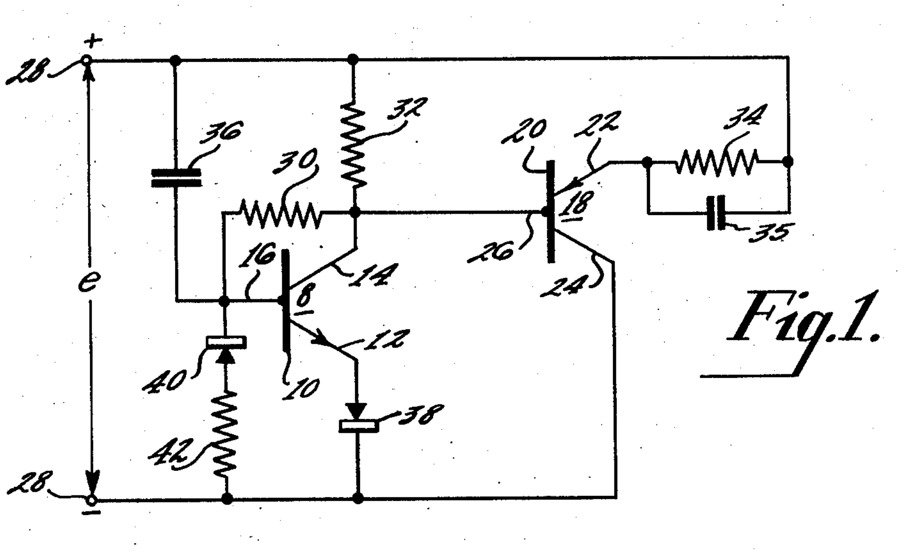

This invention relates in general to filter circuits utilizing semi-conductor devices of opposite conductivity types and in particular to means for stabilizing the circuit operation of such circuits.

Power supplies are generally required to supply a source of direct current potential by rectification from an alternating current line which is relatively free of alternating current components. Generally, however, a power supply rectifier provides a voltage which contains alternating current components in addition to the direct current voltage which is desired. These undesired alternating current components are referred to as "ripple" and their magnitude is defined by the ripple factor. In order to attenuate these ripple components, it is the general practice to connect some form of filtering means in circuit between the rectifier and the output.

Transistors of opposite conductivity or complementary symmetry types may be used to provide filter circuits for removing the alternating current components from a direct current voltage. In such circuits, a pair of opposite conductivity transistors may be connected to form a two-terminal device having a high direct current resistance and a low alternating current impedance. The transistors are so connected that the ripple voltage which is applied to the terminals of the circuit is amplified and a current is fed back in such a manner that the ripple voltage is effectively cancelled. In this manner, efficient and reliable ripple attenuation is accomplished by a circuit which occupies a minimum of space.

In a circuit arrangement of the type described, there is a possibility that the phase shifts due to the circuit components will be such that the circuit oscillates under certain operating conditions. Oscillations of this type are, in general, undesirable and lead to unstable circuit operation. Another difficulty which may be encountered when semi-conductor devices such as transistors are utilized is that the devices themselves may be temperature sensitive. Accordingly, variations in temperature will cause a change in the operating characteristics of the transistors which may also lead to unstable circuit operation.

It is, accordingly, a principal object of the present invention to provide a filter circuit utilizing opposite conductivity type transistors which is stable and efficient in operation.

It is another object of the present invention to provide means for stabilizing a filter circuit utilizing opposite conductivity type transistors wherein undesired oscillations are prevented and circuit stability despite temperature variations is achieved.

These and further objects and advantages of the present invention are achieved, in general, by a circuit arrangement which permits connecting the collector electrode of a transistor of one conductivity type directly with the base electrode of a transistor of an opposite conductivity type. In this manner, the phase shifts which might accompany the use of capacitive coupling are eliminated resulting in stable circuit operation. Moreover, a pair of diodes are connected in the base-emitter circuit of the first transistor in such a manner that stable operation despite variations in the temperature is achieved. Accordingly, the circuit operation of filter circuits embodying the invention is stable and efficient and, therefore, reliable.

Figure 2:
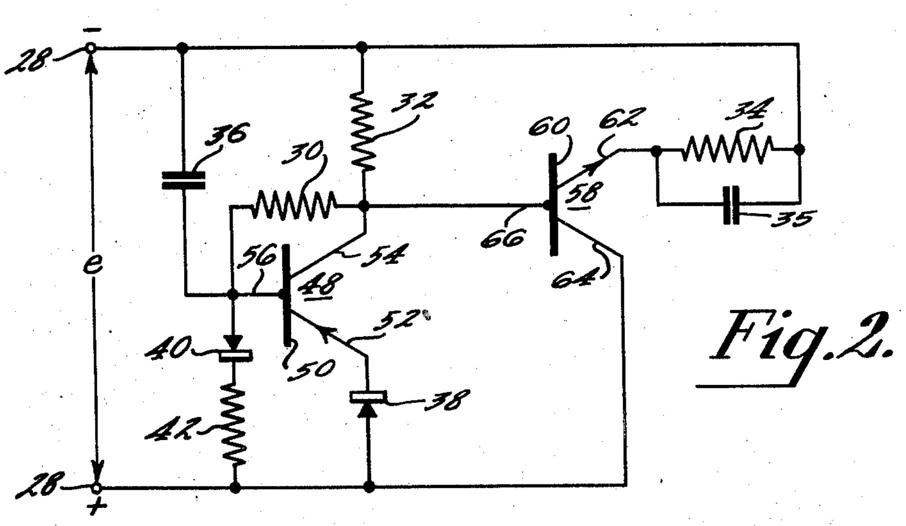

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1 and 2 are schematic circuit diagrams of filter circuits utilizing a pair of opposite conductivity type transistors in accordance with the invention.

Referring now to the drawing, wherein like parts are indicated by like reference numerals in both figures, and referring particularly to Figure 1, a two-terminal shunt filter comprises two transistors 8 and 18. The transistor 8 may be considered to be an N–P–N junction type transistor while the transistor 18 may be considered to be a P–N–P junction type transistor. It should be understood, however, that other types of transistors having characteristics similar to the characteristics of junction transistors could be used equally well.

Each of the transistors comprises a semi-conductive body with which three electrodes are cooperatively associated in a well known manner. Thus, the N–P–N transistor 8 includes a semi-conductive body 10 and an emitter 12, a collector 14 and a base 16. Similarly, the P–N–P junction transistor 18 has a semi-conductive body 20 and an emitter 22, a collector 24 and a base 26.

The filter circuit includes a pair of input terminals 28 to which may be applied a direct current polarizing voltage as well as the unwanted alternating current component or ripple voltage (*e*). The circuit arrangement is such that the polarity of the polarizing voltage is proper for biasing each of the transistors in the conventional manner for normal transistor action. That is, each of the collectors will be biased in the relatively non-conducting or reverse direction with respect to their respective base electrodes while each of the emitters will be biased in the relatively forward or conducting direction with respect to their respective base electrodes. Thus, for a transistor of P type conductivity (i.e., an N–P–N junction transistor) this means that the collector will be positive with respect to the base while the emitter will be negative with respect to the base. For a transistor of N type conductivity (i.e., a P–N–P junction transistor), on the other hand, the collector will be negative with respect to the base while the emitter will be positive with respect to the base.

To apply ripple currents to the N–P–N transistor 8, its signal input path includes a capacitor 36 which is connected in series between the base 16 of the transistor 8 and the upper or positive input terminal 28 for the circuit. A resistor 32 is also connected between the upper or positive input terminal and the collector 14, while a feedback stabilizing resistor 30 is connected between the junction of the collector 14 and the resistor 32 and the base 16.

In accordance with one feature of the invention, stable operation despite changes in the ambient temperature is achieved by a pair of unilateral conducting devices such as illustrated by the diodes 38 and 40, which are connected in the emitter and base circuits respectively of the first or N–P–N transistor 8. The diode 38, which is preferably of the silicon junction type, is poled so as to apply forward bias to the emitter 12 with respect to the base 16. Accordingly, the diode 38 is poled for forward conduction in the direction of normal emitter current flow. A silicon junction diode is preferred because its direct current resistance does not vary greatly with temperature variations. A silicon junction diode may have, for example, an alternating current resistance of 26 ohms for one milliampere of current at 27 degrees centigrade. Accordingly, the silicon diode 38 will be approximately equivalent to a 700 ohm resistor in parallel with a 100 microfarad capacitor at a frequency of 60 cycles per second and does not present an appreciable phase shift. Therefore, a silicon diode is well suit for the present application.

The diode 40, which is preferably of the same semiconductive material as the transistor 8 and may be considered to be, therefore, a germanium diode, has its cathode connected directly with the base 16. Accordingly, the diode 40 is poled for forward conduction in the same direction as that of forward base current flow. A resistor 42 is connected in series between the anode of the germanium diode 40 and the negative or lower input terminal 28. The resistor 42 prevents the shunting of the input current to ground at elevated temperature operation where the alternating current impedance of the germanium diode 40 decreases.

In accordance with another feature of the present invention, the collector 14 of the N–P–N transistor 8 is connected directly with the base 26 of the P–N–P transistor 18, thus providing a direct current conductive path between these two electrodes. To permit this, a resistor 34, which is by-passed for the ripple current by a bypass capacitor 35, is connected in series between the emitter 22 of the P–N–P transistor 18 and the upper or positive input terminal 28. By including the resistor 34 in the circuit, the emitter-to-base voltage of the P–N–P transistor 18 is prevented from reaching a value which is too high. Accordingly, no direct current isolation, by means of a coupling capacitor, for example, is required between the collector 14 and the base 26. The circuit connections are completed by connecting the collector 24 of the P–N–P transistor 18 directly to the lower or negative input terminal 28.

By direct coupling the collector to base as described, several advantages are realized. For one, the phase shifts which attend capacitive coupling and which enhance the possibility of circuit oscillation are eliminated. Thus, by direct coupling, in accordance with the invention, circuit stability is achieved in that the tendency for the circuit to oscillate is minimized. Another advantage is that the emitter voltage of the P–N–P transistor 18 will tend to follow the collector voltage of the N–P–N transistor 8. Accordingly, by stabilizing the transistor 8 with the diodes 38 and 40, the transistor 18 will also be stabilized.

In operation, the small portion of ripple current which flows from the terminals 28 into the base 16 of the N–P–N transistor 8 will result in an amplified current which flows into the collector 14. The magnitude of the current flow into the collector 14 is determined by the current gain of the N–P–N transistor 8. In turn the major portion of this current flows out of the base 26 of the P–N–P transistor 18, resulting in amplified current flow into the emitter 22. The magnitude of the current flowing into the emitter 22 is determined by the current gain of the P–N–P transistor 18. Thus, the application of a small ripple voltage across the input terminals 28 produces an increment of ripple current at the base 16 which results in a comparatively large flow of ripple current between the terminals 28. Thus, the circuit provides a low alternating current impedance and effectively attenuates the undesired alternating current ripple component.

In operation, it can be shown that the two-terminal filter circuits embodying the invention are characterized by a high direct current resistance, so as not to waste power, as well as a low alternating current impedance, thus providing effective filtering action. The direct current resistance of the filter circuit may be determined by the operating points of the transistors. The operating points are, in turn, determined by the amount of ripple current which it is desired to handle. As described, therefore, the filter circuits provide effective and efficient filtering of unwanted ripple voltages, yet occupy a minimum of space.

It can also be readily seen that stable circuit operation is maintained by provision of the invention even though the temperature varies. As an example, as the temperature increases the emitter current of the transistor 8 will also increase. This current flows out of the body 10 and flows through the silicon diode 38. This current flow will develop a voltage across the resistor 42 and the germanium diode 40 which will bias the germanium diode 40 in the reverse direction. By biasing the germanium diode 40 in the reverse direction, saturation current will be permitted to flow through the diode 40. The reverse saturation current of the diode increases, moreover, as the temperature increases.

As is well known and understood, however, one of the factors or characteristics of transistors which make their optimum bias highly temperature sensitive is the leakage saturation current from collector to base ($I_{co}$) of the transistors. Without some means of stabilizing the transistor, for example, a rise in temperature causes an increase in the leakage saturation current flow. The leakage saturation current flows through the base lead of the transistor and since this lead has resistance, a voltage drop is created which creates a bias voltage for the transistor. Accordingly, a bias which varies with temperature is established with the variations of leakage saturation current flow. This results, it can be easily seen, in unstable and, therefore, unreliable operation.

The leakage saturation current of a germanium transistor and the reverse saturation current of a germanium diode will vary at substantially the same rate with temperature variations. Accordingly, the increases of saturation current of the diode 40 will tend to cancel the flow of leakage saturation current in the transistor 8. Accordingly, the effects of the varying leakage saturation current with temperature variations are minimized and substantially eliminated. This provides, in accordance with the invention, stable circuit operation.

While it will be understood that the circuit specifications may vary according to the design for any particular application, the following circuit specifications are included for the circuit of Figure 1 by way of example only:

| | |
|---|---|
| Transistor **8** | RCA type 2N35. |
| Transistor **18** | RCA type 2N34. |
| Resistors **30**, **32**, **34** and **42** | 68,000; 18,000; 4,7000; and 10,000 ohms respectively. |
| Direct current polarizing voltage | 20 volts. |

The conductivity types of the transistors utilized may be reversed, as will be seen from a consideration of Figure 2, reference to which is now made. In this embodiment of the invention, an N type conductivity transistor 48, which may be considered to be of the P–N–P junction type precedes, and is connected in cascade with, a P type conductivity transistor 58 which may be considered to be of the N–P–N junction type. Each of the transistors comprises a semi-conductive body with which three electrodes are cooperatively associated in a well known manner. Thus, the P–N–P transistor 48 includes a semiconductive body 50 and an emitter 52, a collector 54 and a base 56. Similarly, the N–P–N transistor 58 comprises a semi-conductive body 60 having an emitter 62, a collector 64 and a base 66.

In order that the polarity of the various voltages in the circuit be correct for proper operation thereof, the diode 40 is connected in the base circuit of the P–N–P transistor 18 so that its anode is connected directly with the base 56. Accordingly, the diode 40 is poled for forward conduction in the same direction as that of normal base current flow of the transistor 56. The diode 38, on the other hand, has its cathode connected directly with the emitter 52. Thus, the diodes 38 and 40 are each poled in an opposite direction to their counterparts in Figure 1. Since the conductivity of the transistors used has been reversed, it is also essential that the polarity of the direct current polarizing voltage be reversed. Accordingly, the upper input terminal 28 is negative in Figure 2 while the lower input terminal 28 is positive. In other respects the circuit illustrated in Figure 2 is identical to the one illustrated in Figure 1 and operates in a similar manner.

As described herein, filter circuits embodying the invention are stabilized for temperature variations. In addition, the circuits embodying the invention, since direct coupling by the transistors is utilized, will not be prone to undesired oscillation. Accordingly, stable and efficient and, therefore, reliable circuit operation characterizes the circuits embodying the teachings of the present invention.

What is claimed is:

1. A stabilized semi-conductor filter circuit for removing alternating current components from a direct current supply voltage, comprising, a first and a second input terminal, a first semi-conductor device of one conductivity type including a first base, a first emitter and a first collector electrode, a second semi-conductor device of an opposite conductivity type including a second base, a second emitter and a second collector electrode, means including a first unilateral conducting element connecting said first emitter electrode with said first terminal, means connecting said first collector electrode and said second emitter electrode with said second terminal, means including a second unilateral conducting element connecting said first base electrode with said first terminal, said first and second unilateral conducting elements providing stable circuit operation of said first and second semi-conductor devices with temperature variations, means providing an alternating current signal path connected with said first base electrode for applying an alternating current signal thereto, and conductive circuit means coupling said first collector electrode with said second base electrode, said filter circuit providing a relatively low impedance to said alternating current and a relatively high resistance to direct current.

2. A filter circuit as defined in claim 1 wherein said first unilateral conducting element is poled for forward conduction in the same direction as that of normal emitter current flow of said first semi-conductor device and wherein said second unilateral conducting element is poled for forward conduction in an opposite direction to that of normal base current flow of said first semi-conductor device.

3. A filter circuit as defined in claim 2 wherein said first unilateral conducting element is a silicon diode and said second unilateral conducting element is a germanium diode.

4. Means for stabilizing a two-terminal semi-conductor circuit including at least a pair of cascade connected transistors each having a base, an emitter and a collector electrode, means providing a source of direct current voltage connected across said terminals, means for applying said voltage to said electrodes, and means providing a signal input path connected between one of said terminals and the base electrode of one of said transistors, comprising, in combination, a first unilateral conducting element serially connected with the base electrode of said one of said transistors and one of said terminals and poled for forward conduction in the same direction to that of normal base current flow of said one of said transistors, and a second unilateral conducting element serially connected with the emitter electrode of said one of said transistors and said one of said terminals and poled for forward conduction in the same direction to that of normal emitter current flow of said one of said transistors.

5. The combination defined in claim 4 wherein said first unilateral conducting element is a germanium diode and said second unilateral conducting element is a silicon diode.

6. The combination defined in claim 4 wherein the collector electrode of said one of said transistors is connected directly with the base electrode of the other of said transistors whereby said first and second unilateral conducting elements provide stable circuit operation of both of said transistors with ambient temperature variations.

7. The combination defined in claim 6 wherein a resistor is connected serially between said germanium diode and said one of said terminals.

References Cited in the file of this patent

UNITED STATES PATENTS

| | | |
|---|---|---|
| 2,261,335 | Braden | Nov. 4, 1941 |
| 2,324,797 | Norton | July 20, 1943 |
| 2,666,819 | Raisbeck | Jan. 19, 1954 |
| 2,675,433 | Pankove | Apr. 13, 1954 |
| 2,693,565 | Edwards | Nov. 2, 1954 |
| 2,698,416 | Sherr | Dec. 28, 1954 |
| 2,751,545 | Chase | June 19, 1956 |
| 2,751,548 | Gunderson | June 19, 1956 |
| 2,751,549 | Chase | June 19, 1956 |

OTHER REFERENCES

"Junction Transistor Equivalent Circuits and Vacuum-Tube Analogy" by Giacoletto, pp. 1490–1493, Pro. IRE, vol. 40, No. 11, for November 1952.